United States Patent [19]
Oyama

[11] Patent Number: 5,614,903
[45] Date of Patent: Mar. 25, 1997

[54] DISTORTION SUPPRESSOR FOR DIGITAL-TO-ANALOG CONVERTER

[75] Inventor: Bert K. Oyama, Torrance, Calif.

[73] Assignee: TRW Inc., Redondo Beach, Calif.

[21] Appl. No.: 521,342

[22] Filed: Aug. 29, 1995

[51] Int. Cl.$^6$ ....................................................... H03M 1/66
[52] U.S. Cl. .......................................... 341/118; 341/143
[58] Field of Search ..................................... 341/118, 143

[56] References Cited

U.S. PATENT DOCUMENTS

| | | |
|---|---|---|
| 3,707,713 | 12/1972 | Diez et al. . |
| 3,717,777 | 2/1973 | Cecil . |
| 3,736,585 | 5/1973 | Langheinrich . |
| 3,869,085 | 3/1975 | Green . |
| 4,101,881 | 7/1978 | De Freitas ............................ 340/347 R |
| 4,132,908 | 1/1979 | Hughes . |
| 4,493,091 | 1/1985 | Gundry . |
| 4,519,401 | 5/1985 | Ko . |
| 4,573,033 | 2/1986 | Kolodin . |
| 4,584,559 | 4/1986 | Penney . |
| 4,638,260 | 1/1987 | Hamley . |
| 4,766,328 | 8/1988 | Yang . |
| 4,845,498 | 7/1989 | Kubo et al. . |
| 4,868,411 | 9/1989 | Ishihara . |
| 4,998,108 | 3/1991 | Ginthner . |
| 5,041,831 | 8/1991 | Bohley et al. . |
| 5,059,977 | 10/1991 | Herman et al. . |
| 5,123,023 | 6/1992 | Santarelli et al. . |
| 5,321,401 | 6/1994 | White . |
| 5,355,134 | 10/1994 | Kasuga et al. . |
| 5,392,043 | 2/1995 | Ribner ..................................... 341/143 |

Primary Examiner—Jeffrey A. Gaffin
Assistant Examiner—Peguy JeanPierre
Attorney, Agent, or Firm—Michael S. Yatsko

[57] ABSTRACT

A circuit arrangement for suppressing spurious frequency components of an analog output of a digital-to-analog converter (DAC) features a track-and-reset sampling circuit coupled between the output of the DAC and a linearized differential buffer amplifier circuit including a filter circuit for minimizing high frequency distortion normally accompanying the output of a DAC operating at high frequencies, such as on the order of 500 MHz.

12 Claims, 2 Drawing Sheets

5,614,903

DISTORTION SUPPRESSOR FOR DIGITAL-TO-ANALOG CONVERTER

BACKGROUND OF THE INVENTION

The present invention relates to digital-to-analog conversion. More particularly, the invention pertains to the minimization of spurious signal components in high speed digital-to-analog converter (DAC) outputs.

A commonly employed architecture for the implementation of fast-hopping frequency synthesizers consists of a digital sine wave generator driving a DAC. The spurious frequency content of the analog output (i.e. non-fundamental energy) of the DAC is a critical performance standard for such synthesizers. Existing DACs have failed to provide the level of performance required by most high performance systems. This is especially true for wide band (on the order of greater than 50 MHz bandwidth) fast-hopping synthesizer systems.

Removal of spurious signals from the DAC output is often referred to as "deglitching." I am unaware of any published monolithic DACs incorporating the unique deglitcher function of my invention, nor am I aware of any such circuitry for achieving the high performance demonstrated by the circuitry described herein.

SUMMARY OF THE INVENTION

In accordance with my invention, an arrangement for suppressing spurious frequency components of an analog output of a digital-to-analog converter includes a track-and-reset switching circuit having an input coupled to an output of the digital-to-analog converter, and a linearized, differential buffer amplifier circuit having an input coupled to an output of the track-and-reset switching circuit, the buffer amplifier circuit including a filter circuit coupled to the buffer amplifier circuit input for minimizing high frequency distortion of the digital-to- analog converter output signal.

In a more detailed version of the invention, an arrangement for suppressing spurious frequency components appearing across first and second differential analog outputs of a digital-to-analog converter having a predetermined sampling frequency includes first and second track-and-reset switches respectively coupled to the first and second differential digital-to-analog converter analog outputs, a two-pole active filter having first and second inputs respectively coupled to first and second outputs of the first and second track-and-reset switches, and a linearized differential buffer amplifier having first and second inputs respectively coupled to first and second outputs of the two-pole active filter and having first and second complementary outputs carrying an analog signal substantially free of spurious frequency components.

It is a feature of this invention that significant reduction of undesirable spurious energy in the converter output frequency spectrum is effected.

It is an additional feature of this invention that the track and reset nature of the sampling switch utilized at the output of the digital-to-analog converter makes the first and second frequency replicas usable with high fidelity, thereby reducing the requirement for frequency up-conversion or frequency multiplication in a receiver synthesizer system utilizing the distortion suppressor of the invention.

BRIEF DESCRIPTION OF THE DRAWING

The objects and features of the invention will become apparent from a reading of a detailed description of a preferred embodiment of the invention taken in conjunction with the drawing, in which.

DETAILED DESCRIPTION

Figure 1:
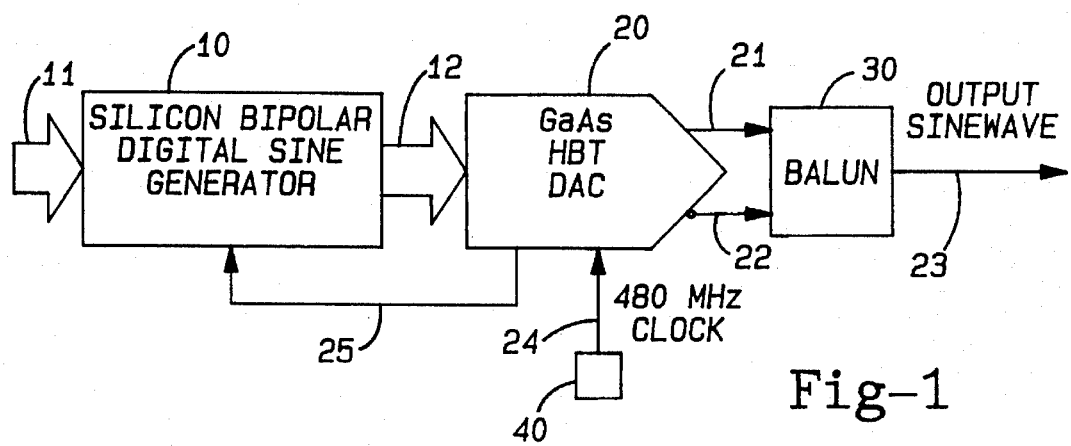
FIG. 1 is a functional block diagram of a direct digital frequency synthesizer incorporating the principles of the invention.

The deglitcher or spurious signal suppressor of the invention may, for example, be incorporated into a high performance direct digital frequency synthesizer system as set forth in the functional block diagram of FIG. 1. In such a synthesizing system, a frequency control word appears in digital form on bus 11 as an input to a silicon bipolar digital sine generator 10. The output of generator 10 appears as a multibit digital signal on bus 12 and is coupled as an input to a gallium arsenide heterojunction bipolar transistor implementation of a digital-to-analog converter utilizing integrated circuit technology. Converter 20 incorporates the deglitching function disclosed later in this description. Converter 20 is driven by a high frequency clock 40 and delivers a bipolar complementary output at leads 21 and 22 which are coupled to a balanced-to-unbalanced transformer circuit 30 whose output 23 presents the analog sine wave being synthesized.

The invention disclosed herein solves the poor spurious performance or glitch problem of existing high-speed converters through a novel implementation of a deglitching circuit at the output of a conventional high frequency digital-to-analog converter. The benefits of a deglitched converter output are known, but none of the existing implementations have achieved the level of spurious signal suppression obtained with the approach shown herein.

Figure 2:
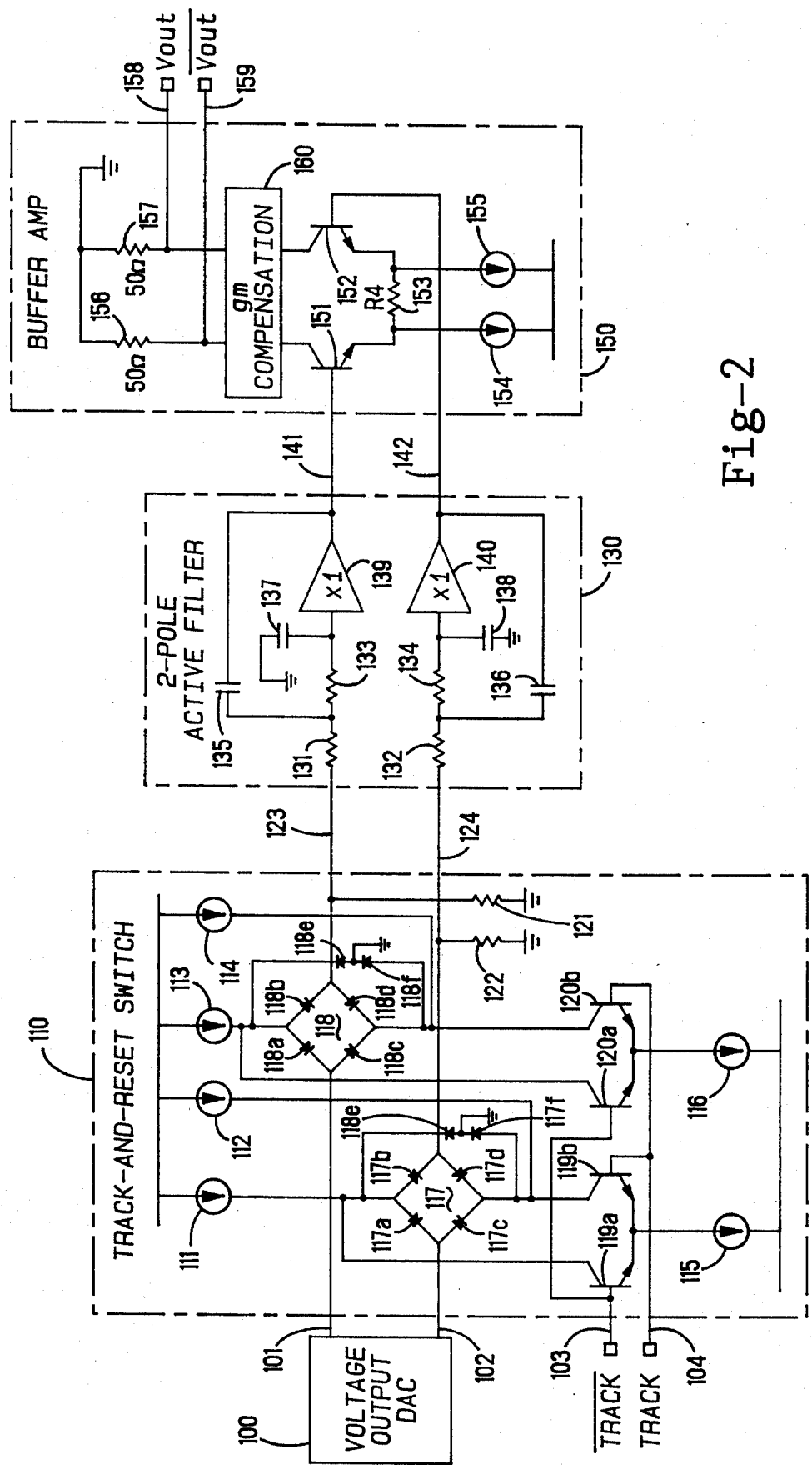
FIG. 2 is a circuit schematic of a deglitcher circuit arranged in accordance with the principles of the invention.

With reference to FIG. 2, a differential voltage output at leads 101 and 102 of conventional digital-to-analog converter 100 is coupled to a track-and-reset switch 110. The differential outputs of switch 110 at leads 123 and 124 are coupled to inputs of a two-pole active filter 130. Filter outputs 141 and 142 are coupled to inputs of a linearized buffer amplifier 150 having a differential output pair 158 and 159 across which appears the analog voltage characterized by low distortion and representing the analog version desired.

Track and reset switch 110 comprises two Schottky barrier diode bridges, one for each complementary output 101 and 102 of the converter. Converter output 101 is coupled to an input of sampling switch 118 while converter output 102 is coupled to an input of sampling switch 117.

A Track request at lead 104 is coupled to a base electrode of transistors 119$b$ and 120$b$, while the complementary Track signal at lead 103 is coupled to base electrodes of transistors 119$a$ and 120$a$.

Current sources 111 and 112 are associated with switch 117 as shown, while sources 113 and 114 are associated with switch 118, as shown. Current source 111 has its output coupled to the top of the diamond bridge switch 117 at the junction of the anode electrodes of Schottky barrier diodes 117a and 117b. Current source 112 is coupled to the bottom of the diamond bridge switch at the junction of the cathode electrodes of Schottky barrier diodes 117c and 117d. Clamping diodes 117e and 117f are coupled in series between the bottom and top of the diamond switch 117. The junction of the anode electrode of diode 117e and the cathode electrode of 117f is coupled to reference potential, specifically in this example ground potential. The output of current source 111 along with the top node of bridge switch 117 is additionally coupled to a collector electrode of control transistor 119a. The output of current source 112 along with the bottom node of bridge switch 117 is additionally coupled to a collector electrode of control transistor 119b.

The emitter electrodes of control transistors 119a and 119b are commonly coupled to current source 115, as shown.

The diamond Schottky barrier diode bridge 118 is similarly configured, having an input coupled to the output 101 of the digital-to-analog converter 100. A junction of the anode electrode of diode 118a and the anode electrode of diode 118b at the top node of diamond switch 118 is coupled to current source 113 and to a collector electrode of control transistor 120a. Current source 114 is coupled at the bottom node of diamond switch 118 at a junction of the cathode electrodes of diodes 118c and 118d, and current source 114 is additionally coupled with the aforesaid bottom node to a collector electrode of control transistor 120b. Clamping diodes 118e and 118f are series-connected, as shown, between the bottom node of diode switch 118 and the top node thereof. Additionally, the junction of the cathode electrode of diode 118f and the anode electrode of diode 118e is coupled to reference potential, in this case ground potential.

The emitter electrodes of control transistors 120a and 120b are commonly coupled to current source 116.

The output of diamond Schottky barrier diode switch 118 is coupled to output 123 of the track-and-reset switch 110, while the output of diamond switch 117 is coupled to output 124 of switch 110. Additionally, load resistor 121 is coupled between output 123 and ground potential, while load resistor 122 is coupled between output 124 and ground potential.

Active filter 130 has a first input coupled to switch output 123 and a second input coupled to switch output 124. The first input is coupled by resistors 131 and 133 to an input of unity-gain amplifier 139, while the second input is coupled via series resistors 132 and 134 to an input of a second unity-gain amplifier 140.

Capacitor 137 is coupled between the input to amplifier 139 and ground potential, while capacitor 138 is coupled between the input of amplifier 140 and ground potential. Feedback capacitor 135 is coupled between an output of amplifier 139 and the junction of resistors 131 and 133. Similarly, feedback capacitor 136 is coupled between an output of unity-gain amplifier 140 and the junction of resistors 132 and 134. Differential filter outputs 141 and 142 are coupled to outputs of amplifiers 139 and 140, respectively.

Buffer amplifier 150 has a first input coupled to output 141 of filter 130 and a second input coupled to output 142 of filter 130. The first buffer amplifier input is coupled to a base electrode of amplifier transistor 151, while a second buffer amplifier input is coupled to a base electrode of amplifier transistor 152. Emitter electrodes of transistors 151 and 152 are coupled together via emitter degeneration resistor 153. An emitter electrode of transistor 151 is coupled to current source 154 while an emitter electrode of transistor 152 is coupled to current source 155. The collector electrodes of transistors 151 and 152 are coupled to a transconductance compensation circuit 160 whose outputs are coupled to a first amplifier output 158 and a second complementary output 159. Additionally, output 159 is coupled via resistor 156 to ground potential while output 158 is coupled via resistor 157 to ground potential.

The basic general operation of the circuitry of FIG. 2 may be summarized, as follows. The differential output voltage of the DAC at converter outputs 101 and 102 is coupled to respective inputs of the Schottky diode bridge switches 118 and 117. During a DAC level transition, the bridge switches are opened (in the reset mode). Since the outputs of the switches 118, 117 are terminated respectively with resistors 121, 122 to a fixed DC potential (in this case ground potential), the voltage at the outputs of the switches settles to this DC potential. When the DAC output has completed its level transition (i.e., fine settling mode, prior to the start of the next level transition), the switches 118, 117 are turned on (in the Track mode) which forces the switch outputs to step and settle to the new DAC voltage level. This track and reset action effectively filters out the nonlinear transient energy produced by the DAC output transitions.

In order to interface the switch outputs 123, 124 with a normal 50 ohm system, a buffer amplifier 150 is coupled to the switch outputs 123, 124 via filter 130. Buffer amplifier 150 comprises a differential pair of transistors 151, 152 with emitter-degeneration-providing resistor 153 and feed-forward transconductance compensation circuit 160. The emitter degeneration and transconductance compensation are effective at linearizing the amplifier output up to frequencies approaching twice the DAC sampling frequency. The tendency of amplifier 150 to distort the high frequency components of the DAC output is minimized by employing a two-pole active filter 130 coupled between the inputs to amplifier 150 and the outputs 123, 124 of the track and reset switches 110. The filter pole is set at approximately twice the DAC sampling frequency. Filter 130 reduces the intermodulation distortion (IM) products appearing at the outputs 158, 159 of amplifier 150 (i.e., the high frequency amplifier nonlinearity produces IM products which fall in-band at lower frequencies).

Figure 3:
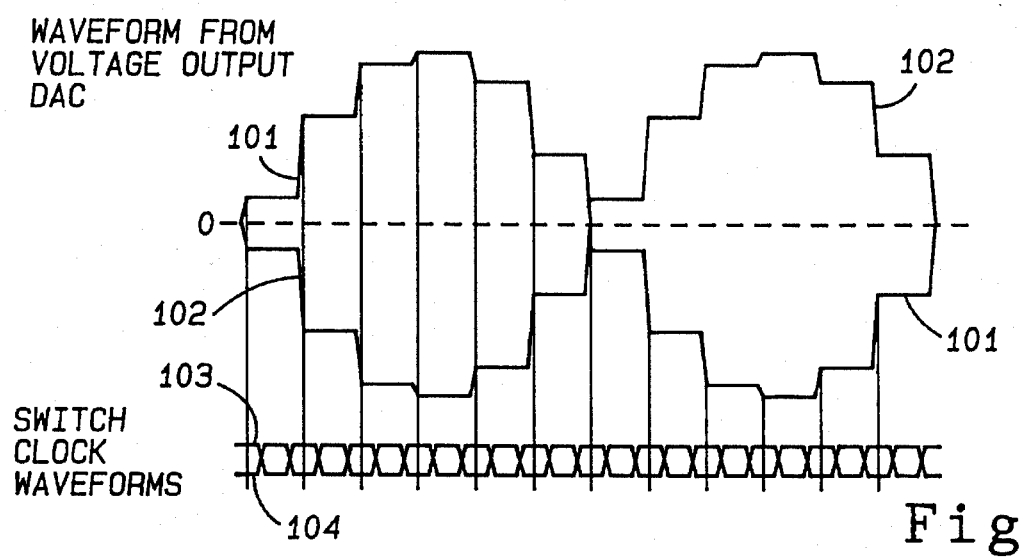
FIG. 3 is a waveform diagram setting forth exemplary signals appearing at the outputs of the digital-to-analog converter of FIG. 2.

Hence, as seen from FIG. 2, the low distortion, high speed DAC consists of four major elements. These elements are a voltage output DAC 100, a track and reset switch 110, a two-pole active filter 130, and a linearized buffer amplifier 150. The voltage output DAC 100 receives a multibit digital word which represents the magnitude of a given phase of a sine wave. This word is updated once every converter clock cycle. The output of the DAC is a differential analog voltage value appearing on leads 101 and 102 and corresponding to the current digital input word. A typical DAC output voltage waveform is depicted in FIG. 3 and labeled 101 and 102, corresponding to the respective outputs of DAC 100 of FIG. 2. These waveforms comprise the true and complementary analog DAC outputs, respectively.

Figure 4:
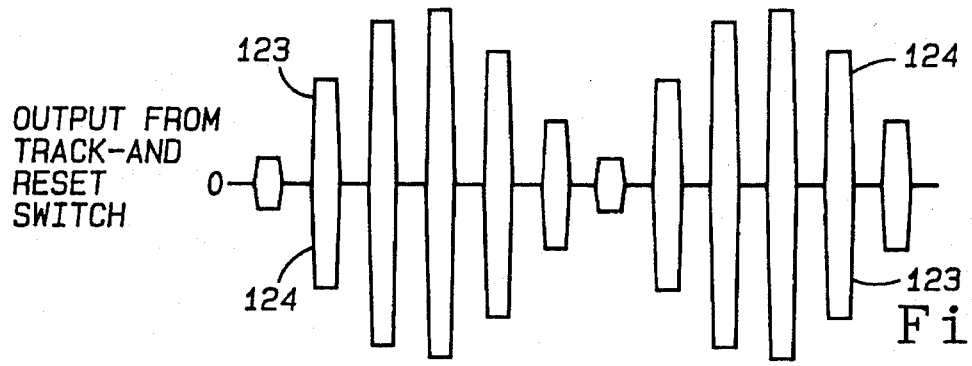
FIG. 4 is a waveform diagram setting forth exemplary signals appearing at the outputs of the track-and-reset switch of FIG. 2.

The DAC outputs at 101, 102 are fed into the track and reset switch stage 110. This switch 110 operates as a single pull-single throw series switch. When the switch is in the "open" position (Track signal at input 103 is logic "high"), the switch differential output at 123, 124 is forced to a fixed DC potential (in this case ground potential). When switch 110 is in the "closed" position (Track signal at input 104 is logic "high"), the switch output tracks the switch input (which is the output of the DAC). If the Track/Reset clock rate (waveforms 104 and 103, respectively, of FIG. 3) is equal to the frequency of the DAC data transitions and properly phase-aligned to those transitions, the effect of the track-and-reset switch 110 is to effectively blank out the DAC voltage from the switch output during the converter's transition phases. This removes the non-linear switching transient signals which would otherwise be present in the voltage DAC output. The output of the Track/Reset switch 110 tracks the DAC output voltage only when the DAC waveform has settled from these nonlinear transients. The track-and-rest output waveforms are shown in FIG. 4, and the switch outputs are labeled 123 and 124, respectively. These waveforms are the respective true and complementary track-and-reset switch outputs.

The conventional operation of each Schottky barrier diode bridge sampling circuit or switch 117, 118 is identical. Therefore, for purposes of this description, the switch operation for switch 117 is set forth, with the understanding that the description will apply in a similar manner to switch 118.

In the reset or isolation mode wherein switch 117 is to be open and therefore isolating its output from its input, a request for such mode of operation is effected via a logic high signal appearing at control input 103. A logic high at 103 renders transistor 119a conductive. Current from source 111 is therefore diverted away from bridge 117 to the collector emitter circuit of transistor 119a. When transistor 119a turns on, clamping diodes 117e, f are rendered conductive to clamp the voltage at a junction of diodes 117a, 117b to ground potential minus the forward drop of diode 117e, and to clamp the voltage at the junction of diodes 117c and 117d to ground potential plus the forward drop of diode 117f, which, in turn, holds bridge diodes 117a, b, c, d off. With the bridge diodes non-conductive, switch 117 takes its non-sampling or isolation mode thereby isolating the diamond switch output from the switch input and forcing the switch output to a preselected reference potential (such as ground).

When sampling or tracking is to be effected, a logic high signal at control input 104 renders transistor 119b conductive to turn off clamping diodes 117e, f thereby allowing bridge diodes 117a–d to conduct. Sources 111 and 112 are each designed to deliver one-half the current flowing in source 115. Therefore, current through the collector-emitter circuit of control transistor 119b is substantially equal to the current in source 115. One-half of this current from source 111 and one-half from source 112 flows through the diode bridge switch 117 to render each bridge leg diode 117a, b, c, d conductive. Hence, the potential at bridge switch input 102 will equal the bridge switch output at 124. When the voltage output of the DAC 100 at lead 102 varies, the output 124 of switch 117 will simply track the change via closed sampling bridge switch 117.

Figure 5:
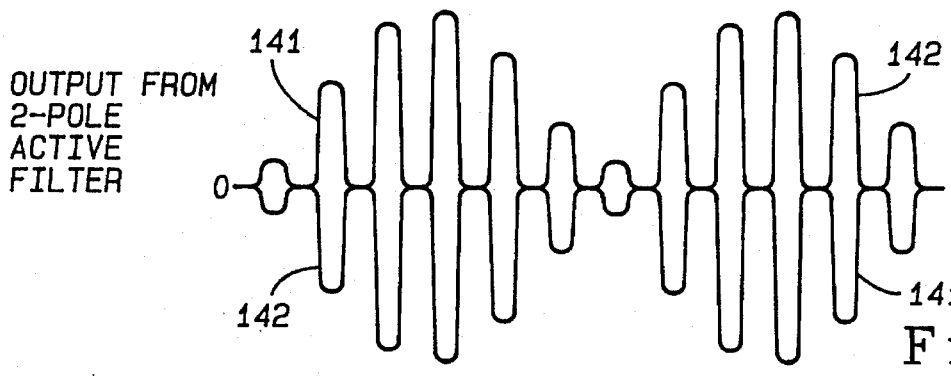
FIG. 5 is a waveform diagram setting forth exemplary signals appearing at the outputs of the active filter of FIG. 2.

The output from the track-and-reset switch 110 is then fed to a two-pole active filter stage 130. Filter 130 utilizes a conventional active R-C low pass filter arrangement, with the filter elements 131–138 selected to achieve a cutoff frequency of approximately twice the data rate frequency of the converter and with a minimum step response settling time. The purpose of filter 130 is to eliminate very high frequency components from the DAC waveform which, in turn, minimizes intermodulation distortion products produced in the following buffer amplifier stage 150. The active filter 130 output waveforms are depicted in FIG. 5 with designations 141 and 142. These waveforms represent the true and complementary filter outputs 141 and 142 of FIG. 2, respectively.

The final circuit stage of FIG. 2 is a high linearity buffer amplifier 150. This circuit is required to properly interface the output of filter 130 with a standard system, such as a 50 ohm system. Therefore, buffer amplifier 150 provides impedance translation to maintain good output voltage standing wave ratio. The challenging requirement for this circuit is to perform this impedance translation without introducing any undesirable non-linearities (i.e., distortion) into the output waveform, while maintaining reasonable DC power consumption. This is accomplished using a linearizing technique called transconductance compensation.

The transistor parameter referred to herein as tranconductance refers to the effective resistive impedance seen looking into the emitter circuit of bipolar transistor 151 or 152. Transconductance is the effective reciprocal of the resistance of the bipolar transistor's emitter circuit which varies in a non-linear matter with varying emitter current. This non-linear transconductance gives rise to distortion during normal operation of the amplifier. Transconductance compensation minimizes the distortion caused by this non-linearity by replicating the non-linearity and then subtracting it from the transistor output at compensation circuit 160 to effect distortion cancellation. Circuit 160 utilizes a known approach described, for example, in an article by Simpkins and Gross, Cascomp Feed-Forward Error Correction in High Speed Amplifier Design, IEEE Journal of Solid State Circuits, Volume SC-18, No. 6, December, 1983, pages 762–764.

The output waveforms at 158, 159 of amplifier 150 appear nearly identical to the active filter output waveforms at 141, 142 respectively and differ only in signal amplitude and DC common mode level.

The result of employing the circuitry set forth in FIG. 2 is the significant reduction of undesirable spurious energy in the converter output frequency spectrum. Additionally, the track-and-reset (as opposed to the more commonly employed track, or sample, and hold) characteristic makes the first and second frequency replicas usable with high fidelity. This can eliminate or reduce the requirement for frequency up-conversion or frequency multiplication in a receiver synthesizer system.

The invention has been described with reference to a detailed description of an embodiment which is set forth for the sake of example only. The scope and spirit of the invention are to be derived from a proper interpretation of the appended claims.

I claim:

1. An arrangement for suppressing spurious frequency components of an analog output of a digital-to-analog (D/A) converter, the arrangement comprising:

a track-and-reset switching circuit having an input coupled to an output of the D/A converter, the track-and reset switching circuit blanking out the D/A converter output during transition phases of the analog output;

a filter circuit having an input coupled to an output of the track-and-reset switching circuit; and a linearized, differential buffer amplifier circuit having an input coupled to an output of the filter circuit, the filter circuit being coupled to the buffer amplifier circuit input and minimizing high frequency distortion of the D/A converter output signal.

2. The arrangement of claim 1, wherein the D/A converter operates with a predetermined sampling frequency and the filter circuit comprises a two-pole active filter having a pole set at approximately twice the D/A converter sampling frequency.

3. The arrangement of claim 1 wherein the buffer amplifier circuit further comprises a pair of differentially coupled amplifier transistors having means for providing transistor emitter degeneration.

4. The arrangement of claim 3 wherein the pair of differentially coupled amplifier transistors further include means for providing feed-forward transconductance compensation.

5. The arrangement of claim 1 wherein the buffer amplifier circuit further comprises a pair of differentially coupled amplifier transistors having means for providing feed-forward transconductance compensation.

6. An arrangement for suppressing spurious frequency components appearing across first and second differential analog outputs of a digital-to-analog (D/A) converter having a predetermined sampling frequency, the arrangement comprising:

first and second track-and-reset switches respectively coupled to the first and second differential D/A converter analog outputs, the track-and-reset switches operative to blank out the first and second analog outputs of the converter during transition phases of the analog outputs;

a two-pole active filter having first and second inputs respectively coupled to first and second outputs of the first and second track-and-reset switches; and a linearized differential buffer amplifier having first and second inputs respectively coupled to first and second outputs of the two-pole active filter and having first and second complementary outputs carrying an analog signal substantially free of spurious frequency components.

7. The arrangement of claim 6, wherein a pole of the active filter is set at approximately twice the sampling frequency of the D/A converter.

8. The arrangement of claim 6, wherein each track-and-reset switch further comprises a Schottky diode bridge having an input coupled to one of the first and second D/A converter analog outputs and an output resistively coupled to a predetermined reference potential level.

9. The arrangement of claim 8 wherein each track-and-resist switch further comprises means for closing each switch whenever the D/A converter has settled to a new output potential level and means for opening each switch during transition phases of the D/A converter to force each switch output to a reference potential level, thereby removing undesired switching transient signals from each switch output.

10. The arrangement of claim 6, wherein the buffer amplifier includes first and second differentially coupled transistors having their base electrodes respectively coupled to the first and second amplifier inputs and having their respective emitter electrodes resistively coupled so as to provide emitter degeneration.

11. The arrangement of claim 10, wherein the first and second differentially coupled transistors each have a collector output electrode coupled to means for providing feed-forward transconductance compensation.

12. The arrangement of a claim 6, wherein the buffer amplifier includes first and second differentially coupled transistors having their base electrodes respectively coupled to the first and second amplifier inputs and having their respective collector output electrodes coupled to means for providing feed-forward transconductance compensation.

* * * * *